United States Patent [19]

Iwamatsu

[11] 4,401,738
[45] Aug. 30, 1983

[54] X-RAY LITHOGRAPHY MASK

[75] Inventor: Seiichi Iwamatsu, Suwa, Japan

[73] Assignee: Kabushiki Kaisha Suwa Seikosha, Tokyo, Japan

[21] Appl. No.: 321,997

[22] Filed: Nov. 16, 1981

[30] Foreign Application Priority Data

Nov. 18, 1980 [JP] Japan ................. 55-162395

[51] Int. Cl.³ .............................................. G03C 5/00
[52] U.S. Cl. ....................................... 430/5; 430/312;
430/314; 430/966; 430/967
[58] Field of Search ................ 430/5, 312, 314, 966, 430/967

[56] References Cited

U.S. PATENT DOCUMENTS 3,222,173  12/1965  Belko et al. ........................ 430/312
4,329,410   5/1982  Buckley ................................. 430/5

FOREIGN PATENT DOCUMENTS 53-33568  3/1978  Japan ..................................... 430/5

OTHER PUBLICATIONS

Lyman, Electronics, pp. 92–93, Oct. 11, 1979.
Flanders, J. Vac. Sci. Technol., pp. 1615–1619, Nov./Dec. 1979.
Flanders, Appl. Phys. Lett., pp. 93–96, Jan. 1, 1980.

Primary Examiner—J. Travis Brown
Attorney, Agent, or Firm—Blum, Kaplan, Friedman, Silberman and Beran

[57] ABSTRACT

An X-ray mask including a pattern of X-ray absorbing material on a thin membrane is provided. The mask includes overlapping first and second patterns of X-ray absorbing material. This permits X-ray lithography printing of lines in complex patterns required for large scale integration. The X-ray mask can provide patterns of less than 20 Å in thickness by X-ray irradiation.

11 Claims, 3 Drawing Figures

X-RAY LITHOGRAPHY MASK

BACKGROUND OF THE INVENTION

This invention relates to a mask for X-ray lithography, and in particular to a structure of a mask having a complex pattern for preparing large scale integrated circuits.

A recent method for preparing an X-ray mask for printing lines of less than 20 Å in thickness was disclosed in Fine-Line Lithography Nears Its Day in Electronics, Oct. 11, 1979 at pages 92–93. The X-ray mask suggested therein is formed by deposition at an oblique angle or shadowing of X-ray absorbent material onto relief structures having triangular or square cross-sections. The relief structure is a polyimide membrane. It is replicated by an X-ray or electron beam source onto a structure.

The X-ray masks disclosed to date have a linear pattern which can produce lines of a thickness of 20 Å. However, these X-ray masks are restricted only to linear patterns in a single direction. Such masks are not completely satisfactory for use when a mask having a complex pattern is required, for example, in a mask for preparing a large scale integrated circuit ("LSI").

Accordingly, it is desirable to provide an improved fine-line X-ray lithography mask suitable for LSI.

SUMMARY OF THE INVENTION

An X-ray lithography mask for providing a crossed pattern of fine-lines is provided. The mask includes a mask membrane having a pattern formed on a first side of the membrane and a second pattern on the opposed side of the membrane. X-ray absorbing material is deposited on the surfaces of the membrane and in the grooves of the patterns. The mask is irradiated substantially perpendicular to the surfaces of the mask for forming a matrix-type X-ray pattern on a substrate. The complex mask may be formed on the two opposed principal surfaces of a membrane or may be separately formed and placed adjacent to each other along the line of X-ray irradiation for increasing the degrees of freedom for forming an X-ray pattern.

Accordingly, it is an object of the invention to provide an improved X-ray lithography mask.

A further object of the invention is to provide an improved X-ray lithography mask suitable for use in preparing LSI.

A further object of the invention is to provide an improved X-ray lithography mask for forming patterns of optional directions for forming LSI.

Still another object of the invention is to provide an improved X-ray lithography mask for forming fine-line matrix-shape X-ray lithography patterns.

Still a further object of the invention is to provide an improved X-ray lithography process utilizing a mask prepared in accordance with the invention.

Still other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
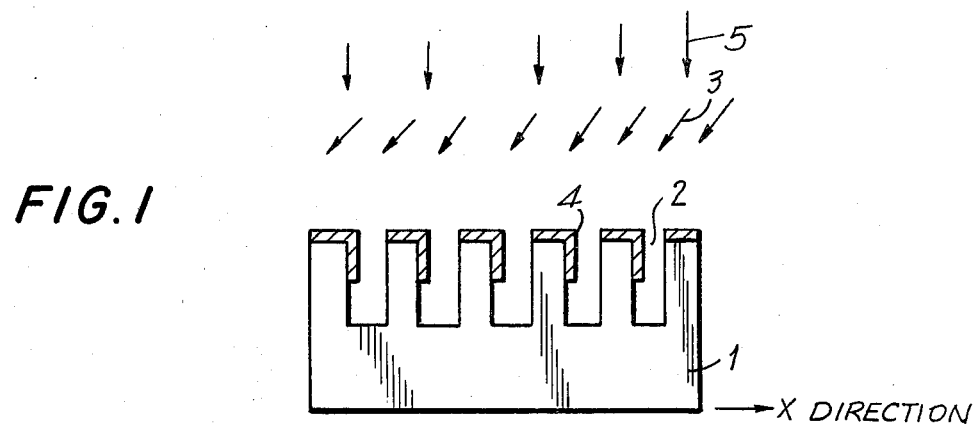
FIG. 1 is a cross-sectional view of an X-ray lithography mask.

FIG. 1 illustrates an X-ray lithography mask which can be used for preparing a micro-pattern of lines less than 20 Å in thickness on a substrate by X-ray lithography. A metal coating 4 of tungsten (W), molybdenum (Mo) or another X-ray absorbing material is deposited on the surface of an $SiO_2$ membrane 1 as follows. Membrane 1 includes a series of grooves 2 on which metal coating 4 of X-ray absorbing material is deposited at an oblique angle or shadowing in a direction shown by an arrow 3. As groove 2 is substantially perpendicular to the principal surface of membrane 1, X-ray absorbing coating 4 is deeper in the region of grooves 2 than the principal surface.

Figure 2:
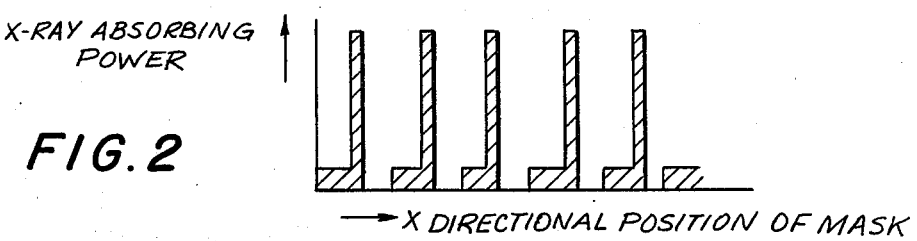
FIG. 2 is a graphical representation of the X-ray absorbing power of the mask illustrated in FIG. 1.

In view of the increase in thickness of X-ray absorbing metal coating 4 within grooves 2, the X-ray absorbing power of metal coating 4 is as illustrated in FIG. 2 in response to a radiation by X-rays in a perpendicular direction shown by an arrow 5. This method is effective for providing fine-line by X-ray lithography; however, it only provides a striped linear pattern in a single direction. In view of this disadvantage, this mask and process cannot be utilized for providing a complex pattern as is required in a mask for preparing LSI.

Figure 3:
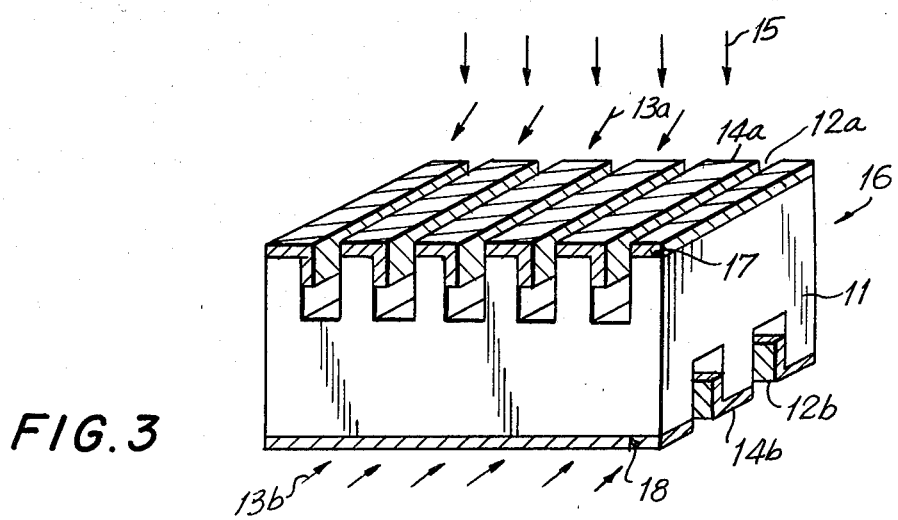
FIG. 3 is a perspective view of an X-ray lithography mask constructed and arranged in accordance with the invention.

Referring now to FIG. 3, a perspective view of an X-ray lithography mask suitable for providing a more complex pattern in accordance with the invention is shown generally as 16. Mask 16 includes a substantially planar $SiO_2$ membrane 11 having a first substantially planar surface 17 and an opposed second substantially planar surface 18. A first pattern element is formed on first surface 17 by forming a series of grooves 12a. A first layer of a tungsten coating 14a is formed by oblique deposition in a direction indicated by an arrow 13a. A second pattern of grooves 12b are formed on second surface 18. A pattern of tungsten X-ray absorbing material 14b is formed on second surface 18 and in grooves 12b by oblique deposition in a direction indicated by an arrow 13b.

In this embodiment of the invention, first series of grooves 12a and second series of grooves 12b are substantially perpendicular to each other. Accordingly, the resulting X-ray lithography mask will provide an X-ray pattern having a matrix-shape. In mask 16 prepared in accordance with the invention, the X-ray mask pattern formed on first surface 17 and the pattern formed on second surface 18 are both crossed by the radiation from parallel X-rays 15 which strike membrane 11 in a substantially perpendicular direction. Accordingly, a complex pattern formed by a combination of the pattern on first surface 17 and the pattern on a second surface 18 is readily provided.

In this embodiment of the invention, the mask having a complex pattern is formed on a single $SiO_2$ membrane 11 by forming a pattern on first surface 17 and a separate pattern on second surface 18. However, the objects of the invention can also be attained by separately producing a mask having a pattern such as that on first layer 17 and a separately layer having a pattern such as that on second surface 18 and then by joining the separate layers into a single body. Additionally, it is also possible to form the separate patterns on separate plates and place them at predetermined intervals intersecting the line of X-ray irradiation.

In the X-ray lithography masks prepared in accordance with the invention as described above, the degrees of freedom for forming patterns for X-ray absorption are increased and micro-patterns can be formed. This permits the X-ray lithography mask to be utilized in preparation of LSI and the like.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An X-ray lithography mask having complex patterns of X-ray absorbing material on a thin membrane, comprising:

a thin membrane having opposed substantially planar surfaces, the first of said planar surfaces having a first pattern of grooves selectively formed thereon and the second planar surface having a second independent pattern of grooves, X-ray absorbing material obliquely deposited on said first and second pattern of grooves, the first and second patterns disposed on the respective surfaces of the membrane for providing a selected complex image pattern on an X-ray sensitive substrate when the mask is irradiated by X-ray irradiation.

2. The X-ray lithography mask of claim 1, wherein the opposed planar surfaces of the membrane are substantially parallel to each other.

3. The X-ray lithography mask of claims 1 or 2, wherein each of the first and second pattern includes parallel grooves.

4. The X-ray lithography mask of claim 3, wherein the parallel grooves of the first and second pattern are substantially perpendicular to each other for forming a matrix on the substrate.

5. The X-ray lithography mask of claim 1, wherein the membrane is a unitary layer.

6. The X-ray lithography mask of claim 1, wherein the membrane is formed of two membranes, each having at least one substantially planar surface with one of the patterns of groove thereon.

7. The X-ray lithography mask of claim 1, wherein the membrane is formed of $SiO_2$.

8. The X-ray lithography mask of claims 1 or 7, wherein the X-ray absorbing material is an X-ray absorbing metal.

9. The X-ray lithography mask of claim 8, wherein the metal is selected from the group consisting of tungsten and molybdenum.

10. The process of forming an X-ray lithography mask comprising:

forming a thin membrane having opposed substantially planar surfaces;
    forming a first pattern of grooves on the first planar surface;
    forming a second independent pattern of grooves on the second planar surface; and
    depositing an X-ray absorbing material on the planar surfaces at an oblique angle thereto.

11. An X-ray lithography process including the steps of irradiating an X-ray lithography mask at an angle substantially perpendicular to the principal planar surfaces, wherein the mask comprises a thin membrane having opposed substantially planar surfaces, the first of said planar surfaces having a first pattern of grooves selectively formed thereon and the second planar surface having a second pattern of grooves independent of the first pattern, X-ray absorbing material obliquely deposited on said first and second patterns of grooves, the first and second patterns disposed for providing a selected complex pattern on an X-ray sensitive substrate when the mask is irradiated by X-ray irradiation.

* * * * *